(12) United States Patent
Pullmann et al.

(10) Patent No.: US 7,705,492 B2
(45) Date of Patent: Apr. 27, 2010

(54) ARRANGEMENT FOR FAILSAFE EVALUATION OF A POSITION ENCODER

(75) Inventors: Juergen Pullmann, Ebersbach (DE); Thomas Nitsche, Esslingen (DE); Guenter Hornung, Leinfelden-Echterdingen (DE); Christoph Zinser, Wolfschlugen (DE)

(73) Assignee: Pilz GmbH & Co. KG, Ostfildern (DE)

( * ) Notice: Subject to any disclaimer, the term of this patent is extended or adjusted under 35 U.S.C. 154(b) by 193 days.

(21) Appl. No.: 12/062,867

(22) Filed: Apr. 4, 2008

(65) Prior Publication Data

US 2008/0246344 A1 Oct. 9, 2008

Related U.S. Application Data

(63) Continuation of application No. PCT/EP2006/008149, filed on Aug. 18, 2006.

(30) Foreign Application Priority Data

Oct. 6, 2005 (DE) .................. 10 2005 048 601

(51) Int. Cl.
*H02H 11/00* (2006.01)
(52) U.S. Cl. ..................................... 307/326
(58) Field of Classification Search .................. 307/326
See application file for complete search history.

(56) References Cited

U.S. PATENT DOCUMENTS

| 5,812,411 A | 9/1998 | Calabrese et al. |
| 5,936,435 A | 8/1999 | Schwenkel et al. |
| 6,787,940 B2 | 9/2004 | Pullmann |
| 6,825,579 B2 * | 11/2004 | Ehrlich et al. ............. 307/113 |
| 2003/0057069 A1 | 3/2003 | Ehrlich et al. |

FOREIGN PATENT DOCUMENTS

| DE | 42 16 467 A1 | 12/1993 |
| DE | 43 22 472 A1 | 1/1995 |
| DE | 44 43 862 A1 | 6/1996 |
| DE | 197 28 596 A1 | 1/1999 |
| DE | 100 09 707 A1 | 9/2001 |
| DE | 100 16 712 C5 | 6/2002 |
| EP | 1 022 570 A2 | 7/2000 |
| EP | 1 494 098 A1 | 1/2005 |
| FR | 2 735 871 | 12/1996 |

* cited by examiner

*Primary Examiner*—Robert L. Deberadinis
(74) *Attorney, Agent, or Firm*—Harness, Dickey & Pierce, P.L.C.

(57) ABSTRACT

A safety switching device comprises a position encoder, such as a potentiometer, for user selection of an operational quantity, such as an operating mode. The position encoder has a first terminal, a second terminal, and a tap moveable through a plurality of positions. A total impedance is defined between the first terminal and the second terminal. A first partial impedance is defined between the first terminal and the tap, and a second partial impedance is defined between the tap and the second terminal. An arrangement for determining an instantaneous position of the tap comprises a first evaluation circuit designed to determine a first measurement value representative of the first partial impedance, and a second evaluation circuit designed to determine a second measurement value representative of the second partial impedance. At least one from the first and second evaluation circuits is designed to determine the instantaneous position of the tap by means of the first and second measurement values.

20 Claims, 4 Drawing Sheets

ARRANGEMENT FOR FAILSAFE EVALUATION OF A POSITION ENCODER

CROSS-REFERENCES TO RELATED APPLICATIONS

This application is a continuation of international patent application PCT/EP2006/008149, filed on Aug. 18, 2006 designating the U.S., which international patent application has been published as WO 2007/039017 A1 in German language and claims priority from German patent application DE 10 2005 048 601.0, filed on Oct. 6, 2005. The entire contents of these priority applications are incorporated herein by reference.

BACKGROUND OF THE INVENTION

The present invention relates to a safety switching device for failsafe disconnection of an electrical load, such as a drive of a dangerous machine, and to an arrangement for failsafe evaluation of a position encoder provided for user selection of an operational quantity, such as an operating mode, in such a safety switching device. More particularly, the invention relates to an arrangement for failsafe evaluation of a position encoder having a first terminal, a second terminal and a moveable tap, wherein a defined total impedance can be detected between the first and second terminal, and wherein a first partial impedance and a second partial impedance can be detected between the respective terminal and the tap.

In general, the invention relates to a device and an arrangement in the field of safety engineering in the sense of protecting personnel from injury by potentially hazardous machines and equipment. Safeguarding such machines and equipment has been performed for many years now using safety switching devices, which evaluate status signals from emergency stop buttons, safety-door switches, light barriers, light curtains and other safety-related signaling devices, and, depending on the evaluation, either disconnect a monitored machine or installation from the power supply, or bring it into a safe state by other means. Safety switching devices are typically used in addition to the operational controllers of the machine or installation. Operational controllers control the "normal" operating procedure of the machine or installation. They are not designed to be "failsafe", however, and hence cannot ensure the desired level of personnel protection.

If a larger number of safety functions is required, programmable safety controllers are typically used, wherein monitoring of the individual signaling devices and their logical dependency can be defined by software programming. For applications having a small or moderate number of safety functions, on the other hand, safety switching devices are mostly used, whose operation can be modified to a certain extent without this requiring software programming by the user. For example, in such safety switching devices, various operating modes can be set, for instance start-up operating modes (automatic start-up, manual start-up, monitored start-up), or delayed/non-delayed shutdown of the machine. In the latter case, the user shall also have the facility to set a delay or select from a number of predefined delays. In addition, in many safety switching devices, it is possible to adjust the operating mode to suit different operating environments, for example whether the safety switching device is supplied with clocked or unclocked status signals. All these settings are collectively referred to below as setting an operational quantity.

Operational quantities can be set, for example, using potentiometers or resistor networks, which provide a variable resistance as a function of the instantaneous position of a control element. For reasons of failsafety, however, at least two redundant position encoders are used for safety switching devices, which is a disadvantage because of the component costs and the need of assembly. DE 100 09 707 A1 thus proposes to combine the switching function of two redundant rotary switches of a safety switching device into one component.

DE 100 16 712 A1 discloses a safety switching device, wherein an operational quantity can be set by supplying one of at least three different input signals to an input terminal of the safety switching device. Depending on the applied input signal, the safety switching device selects one of at least three predefined operating modes. This method has proved highly advantageous, because it dispenses with the expensive and time-consuming assembly of redundant rotary switches or potentiometers. The method does require, however, that there is at least one input terminal available on the safety switching device for supplying the selection signal. This restricts the minimum overall size of a safety switching device.

EP 1 494 098 A1 discloses a method and a device for a largely failsafe evaluation of a potentiometer. The potentiometer is connected in series with one or two defined fixed resistors. The potentiometer, together with the two fixed resistors, forms a voltage divider, and the instantaneous potentiometer position is determined from the divider ratio of the potentiometer. In addition, the voltage drop across the one fixed resistor is determined and compared with a setpoint value. Since the same current flows through the potentiometer and the fixed resistor, the potentiometer can be checked using the fixed resistor. The disadvantage with this method is that the voltage range that can be varied by means of the potentiometer is reduced by the fixed resistors connected in series. This means that the number of potentiometer positions that can be distinguished from each other with failsafe reliability is reduced. In addition, measurement of the potentiometer position is subject to inaccuracies dependent on the tolerances of the fixed resistors. Finally, this circuit is expensive if a plurality of potentiometers are to be evaluated with failsafe reliability.

EP 1 022 570 A2, DE 43 22 472 A1 and U.S. Pat. No. 5,812,411 disclose further circuits for evaluating the position of a potentiometer and for checking correct operation of the potentiometer. These solutions are also expensive, in particular if a plurality of potentiometers are to be monitored with failsafe reliability. In addition, the number of potentiometer positions that can be distinguished from each other is again limited because of tolerances of additional components.

SUMMARY OF THE INVENTION

Against this background, it is an object of the invention to provide an arrangement for failsafe evaluation of an impedance-based position encoder using a small number of components. It is another object of the invention to provide for an inexpensive arrangement that allows failsafe setting of an operational quantity in a safety switching device.

According to one aspect of the invention, there is provided a safety switching device for failsafe shutdown of an electrical load, comprising at least one input terminal for receiving a status signal representing a safety request, an evaluation and control unit for evaluating the status signal, at least one switching element controlled by the evaluation and control unit in response to the status signal, and at least one position encoder for setting an operational quantity, the at least one position encoder comprising a first terminal, a second terminal, and a tap having a variable instantaneous position, with a total impedance being defined between the first terminal and the second terminal, with a first partial impedance being defined between the first terminal and the tap, and with a second partial impedance being defined between the tap and the second terminal, wherein the evaluation and control unit is configured to determine a first measurement value representative of the first partial impedance and to determine a second measurement value representative of the second partial impedance in order to determine the instantaneous position of the tap in a failsafe manner.

According to a another aspect, there is provided an arrangement for failsafe evaluation of a position encoder having a first terminal, a second terminal, and a moveable tap, with a total impedance being defined between the first terminal and the second terminal, with a first partial impedance being defined between the first terminal and the tap, and with a second partial impedance being defined between the tap and the second terminal, the arrangement comprising a first evaluation circuit designed to determine a first measurement value representative of the first partial impedance, and comprising a second evaluation circuit designed to determine a second measurement value representative of the second partial impedance, with at least one from the first and second evaluation circuits being designed to determine an instantaneous position of the tap by means of the first and second measurement values.

The new arrangement can be used not only for monitoring and evaluating a potentiometer, but also for monitoring and evaluating any other impedance-based position encoder. For example, instead of a potentiometer, the position encoder could be a resistor network having selectable resistors. In addition, the total impedance of the position encoder can comprise capacitive and inductive components, i.e. the invention is not restricted to resistive position encoders.

The new device and arrangement are based on the idea of determining by measurement each of the variable partial impedances, which add together to give the total impedance. It is not necessary, however, to make actually an impedance measurement in the narrow sense of the words; it is sufficient to determine representative (but separate) measurement values for the individual partial impedances. Measuring a voltage drop across each of the partial impedances is preferred.

In contrast, in all hitherto known approaches for evaluating and monitoring an impedance-based position encoder, only a divider ratio of the partial impedances is measured. Although it is possible, if the total impedance is known, to calculate the partial impedances, they are not measured separately from each other. The new procedure makes it possible to compare the partial impedances, which are determined separately from one another, with each other and/or with the known or measured total impedance. This enables a plurality of plausibility checks which are very easy to implement in circuitry, and also extremely straightforward, redundant evaluation. In a particularly preferred exemplary embodiment, the new arrangement requires just one fixed resistor in addition to two microcontrollers, for example. Two microcontrollers are frequently used anyway in safety switching devices for reasons of redundancy, so that the component cost here is extremely low.

In summary, the new arrangement enables precise and failsafe evaluation of an impedance-based position encoder using a small number of components. This in turn creates the opportunity to implement failsafe setting of an operational quantity without the need for connecting terminals and/or redundant position encoders. The new arrangement thus enables an extremely compact and cost-effective implementation of a safety switching device or a safety controller that includes failsafe setting of an operational quantity.

In a preferred embodiment, the evaluation unit comprises a first evaluation circuit and a second evaluation circuit, each of which being designed to determine at least one of the measurement values. Preferably, each evaluation circuit can measure each measurement value.

In this embodiment, each of the evaluation circuits can measure the partial impedances of the position encoder. Thus each evaluation circuit is able to determine the instantaneous position of the position encoder. Such an implementation is particularly well suited to safety switching devices.

In a further embodiment, the first evaluation circuit has a first output, and the second evaluation circuit has a second output, each of which being configured to be connected alternately to a high potential or a low potential.

This embodiment enables the position encoder to be supplied alternately with voltages of different polarity. It is then very easy to measure the partial impedances.

In a further embodiment, the first output is connected to the first terminal of the position encoder, and the second output is connected to the second terminal of the position encoder.

In this embodiment, the position encoder effectively lies between the outputs of the evaluation circuits, which outputs can be alternately connected to a high potential or a low potential. The voltage applied across the position encoder can easily be reversed in this manner, which enables the partial impedances to be determined particularly easily. It is obvious here, that the position encoder can also be connected indirectly to the two evaluation circuits, i.e. via intermediate resistors or other components. It is preferable, however, if the position encoder is connected directly between the outputs of the evaluation circuits in order to provide the maximum voltage range for the evaluation.

In a further embodiment, the first output and the second output are connected to the tap.

In this embodiment, the alternately changing voltage is applied to the tap of the position encoder. This enables the first measurement value and second measurement value to be found simultaneously. This means that the evaluation and check can be performed very quickly.

In a further embodiment, at least one switching element is provided that is designed to isolate the position encoder from the first output or the second output.

In other words, this embodiment includes the possibility to make the connection between the position encoder and the outputs of the evaluation circuits high impedance. Advantageously, this can also occur at the output of the evaluation circuit itself. This embodiment is an extremely easy option for measuring the partial impedances by a voltage reversal.

In a further embodiment, the first evaluation circuit has a first input, and the second evaluation circuit has a second input, each of which being connected to the position encoder.

In this embodiment, the position encoder is hence also connected between the inputs of the evaluation circuits. Thus each evaluation circuit can directly read a measurement value representative of the partial impedances. This enables rapid evaluation of the control position with a high level of failsafe reliability.

In a further embodiment, the first input and second input are connected to the tap.

This embodiment enables the first measurement value and the second measurement value to be detected redundantly in each case. Each evaluation circuit can detect each of the two measurement values and determine the associated partial impedance. Thus each partial impedance can be monitored redundantly, which enables a particularly high level of failsafe reliability.

It is particularly preferred if, in this case, the reference impedance also has a first terminal that is connected to the tap.

With this embodiment it is possible to easily and reliably detect drift errors in the position encoder and particularly drift errors in the partial impedances.

In a further embodiment, the first input is connected to the first terminal of the position encoder, and the second input is connected to the second terminal of the position encoder.

In this embodiment, each evaluation circuit detects "its" partial impedance, enabling very fast evaluation of the position encoder.

In a further embodiment, the reference impedance has a second terminal, which is connected to an output of the evaluation unit. It is particularly preferred, if a switching element is additionally provided in order to switch the connection between the reference impedance and the output selectively to high impedance.

With this embodiment it is possible to make the reference impedance for measurement mode "invisible", so that the measurement values representative of the partial impedances are independent of the reference impedance and its tolerances. This enables more precise evaluation of the position encoder with a finer resolution.

In a further embodiment, a plurality of position encoders having a plurality of taps are provided, which are connected together, with each position encoder having a first terminal and a second terminal connected to the evaluation unit.

This embodiment is a very straightforward option that uses very few components to evaluate and monitor a plurality of position encoders in the manner according to the invention. It enables a plurality of operational quantities to be set with very low component costs and requiring very little space.

In a further embodiment, the first evaluation circuit and the second evaluation circuit are integrated circuits, in particular programmable integrated circuits, which are connected together via the position encoder. In particularly preferred embodiments, the integrated circuits are connected together directly via the position encoder. In other words, the position encoder is then connected directly between the integrated circuits.

The use of integrated circuits is particularly advantageous to implement the first evaluation circuit and second evaluation circuit using a microcontroller, microprocessor, FPGA or other integrated logic circuits. The number of components required is thereby minimized. The manufacturing costs and overall space required are correspondingly low.

It goes without saying that the aforementioned features, and the features still to be described below, can be applied not only in each of the combinations given, but also in other combinations or on their own, without going beyond the scope of the present invention.

BRIEF DESCRIPTION OF THE DRAWINGS

Exemplary embodiments of the invention are shown in the drawing, and explained in greater detail in the following description, in which.

DESCRIPTION OF PREFERRED EMBODIMENTS

Figure 1:
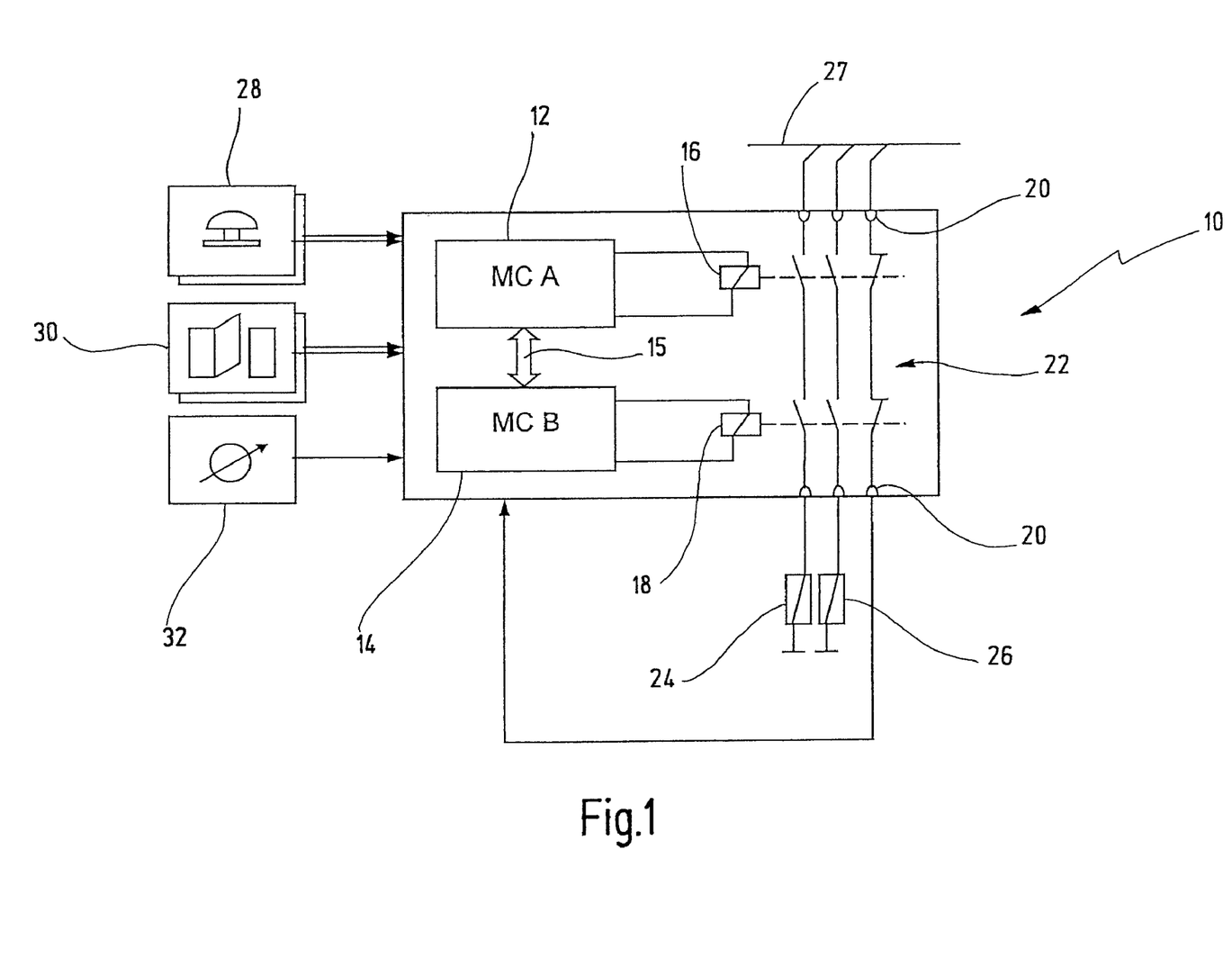
FIG. 1 shows a simplified schematic diagram of a safety switching device for failsafe shutdown of an electrical load according to a preferred exemplary embodiment of the invention.

In FIG. 1, a safety switching device is denoted in its entirety by reference number 10. The safety switching device 10 has a dual-channel design and has two microcontrollers 12, 14, which can communicate with each other via a link 15 in order to compare their data and monitor each other. The link 14 may be a dual-port RAM or a communications interface (e.g. UART) for example.

Each of the microcontrollers 12, 14 controls a relay 16, 18. The switching contacts of the relays 16, 18 lie in series with each other between connecting terminals 20 of the safety switching device 10. They thus form current paths 22 between the connecting terminals 20, which can be opened with failsafe reliability by the microcontrollers 12, 14. The normally-open contacts of the relays 16, 18 form two current paths 22, via which two contractors 24, 26 are connected to an external power supply 27. The contractors 24, 26 are electrical loads in the sense of the present invention and are used, for example, for failsafe disconnection of the drive of a machine (not shown here). The normally-closed contacts of the relays 16, 18 are positively driven by the normally-open contacts, and they form a feedback circuit via which the microcontrollers 12, 14 can read the control state of the relays 16, 18.

The use of relays 16, 18 as output-side switching elements of the safety switching device 10 is to be understood to be an example. The invention can also be used in safety switching devices having semiconductor outputs and, furthermore, also in other equipment and devices in which an impedance-based position encoder is to be evaluated and monitored with failsafe reliability.

On the input side, the safety switching device 10 detects the status signals from one or more emergency stop buttons 28 and from one or more safety-door switches 30. In addition, the safety switching device 10 could also be designed for the connection of other signaling units such as light barriers, light curtains, speed sensors and so on.

A position encoder shown schematically and denoted by reference number 32 is evaluated and monitored in the safety switching device 10 according to the new approach. The illustration of position encoder 32 as an "external" unit is chosen for the sake of simplicity. The position encoder 32 is typically arranged inside an enclosure of the safety switching device 10, with an operating knob, for example a rotary controller, being accessible on one side of the enclosure of the safety switching device 10.

Figure 2:
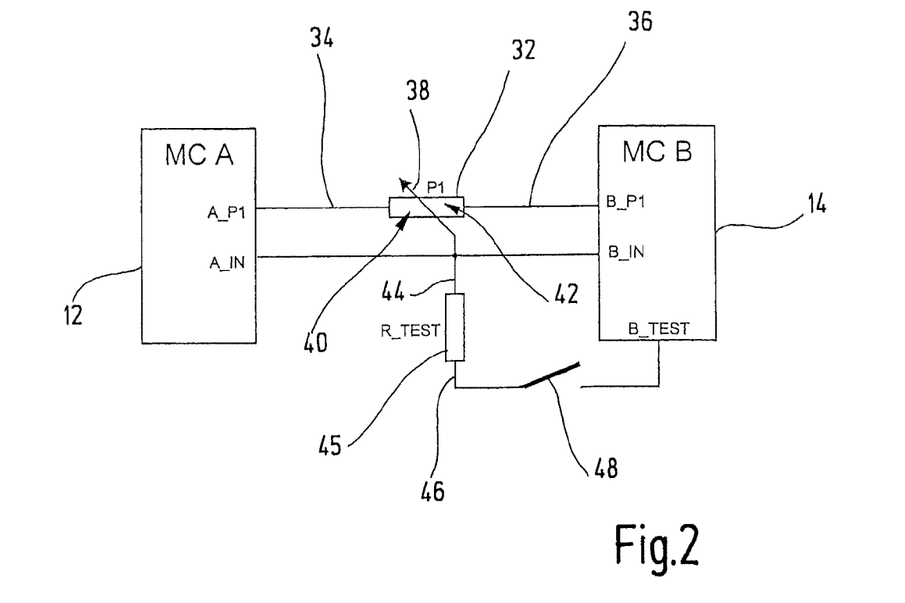
FIG. 2 shows a simplified diagram of a first exemplary embodiment of the new device for failsafe evaluation of a position encoder.

FIG. 2 shows a preferred exemplary embodiment for evaluating and monitoring the position encoder 32. In the particularly preferred exemplary embodiment, the position encoder is a potentiometer having a first terminal 34, a second terminal 36 and an adjustable tap 38. The potentiometer has a defined total impedance between the terminals 34, 36. A first partial impedance and a second partial impedance 40, 42, whose sum equals the total impedance, can be measured at the adjustable tap 38.

The present invention is not limited to evaluating potentiometers, however. It can also be applied to resistor networks and other components or circuit elements in which a total impedance is divided into two (or more) partial impedances via an adjustable tap, and the partial impedances are determined.

The first terminal 34 of the potentiometer 32 is connected to a terminal A_P1 of the microcontroller 12. In the same way, the second terminal 36 of the potentiometer 32 is connected to a terminal B_P1 of the microcontroller 14. The terminals A_P1, B_P1 of the microcontrollers 12, 14 can be connected selectively by the microcontrollers to a high voltage potential (for example the operating voltage) or a low voltage potential (for example ground potential). In addition, the two port inputs of the microcontrollers can be switched to high impedance, which corresponds to disconnecting the first terminal or second terminal 34, 36 respectively from the associated microcontroller 12, 14 (shown in FIGS. 3 and 4).

The tap 38 of the potentiometer 32 is connected both to an input A_IN of the microcontroller 12 and to an input B_IN of the microcontroller 14. The inputs A_IN, B_IN allow the microcontrollers to detect a voltage present at the tap 38 of the potentiometer 32. In a particularly preferred exemplary embodiment, each microcontroller 12, 14 comprises an integrated A/D converter, which converts voltages present at the inputs A_IN, B_IN into a digital value, which can then be processed further by the microcontroller. The voltages present at the inputs A_IN, B_IN are the measurement values representative of the partial impedances 40, 42 of the potentiometer 3.

In addition, the tap 38 is also connected to a first terminal 44 of a fixed resistor 45, which is used here as a reference impedance. The second terminal 46 of the fixed resistor 45 is connected via a switching element 48 to a port B_TEST of the microcontroller 14. Thus the tap 38 of the potentiometer 32 lies in series with the fixed resistor 45, and the series circuit is connected via the switching element 48 to the port B_TEST of the microcontroller 14. Alternatively or additionally, the series circuit could also be connected to a corresponding port A_TEST (not shown) of the microcontroller 12.

The microcontroller 14 is able to apply a ground potential to the port B_TEST. In addition, the connection between the fixed resistor 45 and the microcontroller 14 can be switched to high impedance via the switching element 48. The switching element 48 is shown here for illustrative purposes. In preferred exemplary embodiments, the microcontroller 14 is able to switch the port B_TEST to high impedance via an integrated switching element (not shown).

Figure 3:
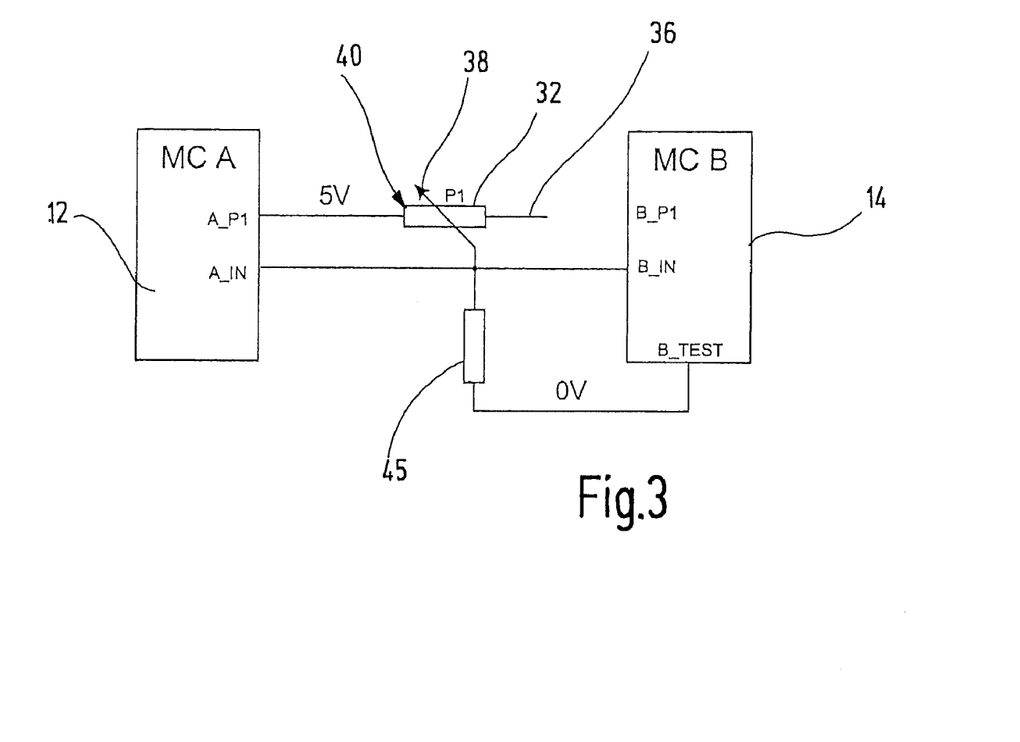
FIGS. 3 and 4 show the device from FIG. 2 in two different operating states.
Figure 4:
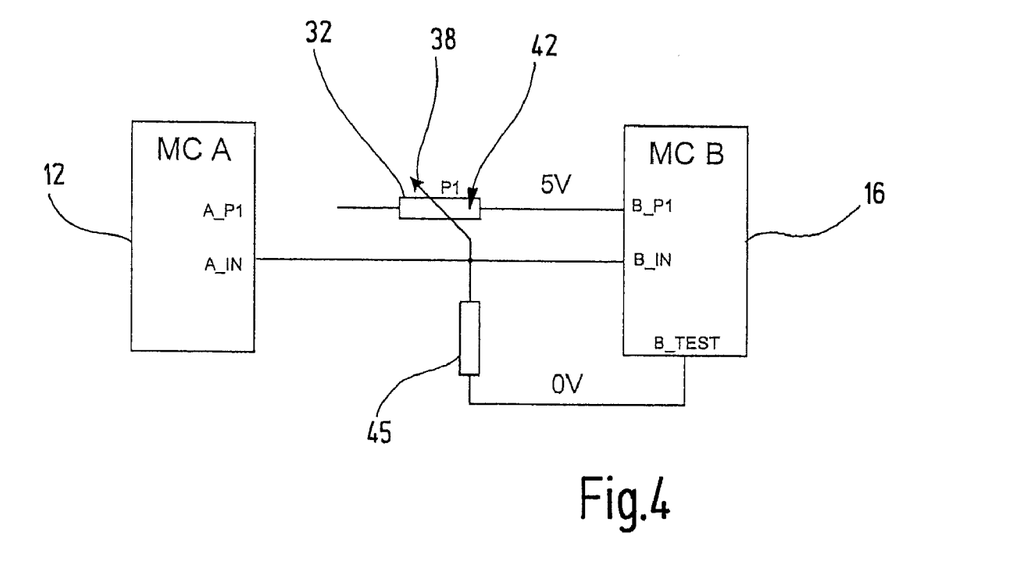

FIGS. 3 and 4 illustrate the operating principle of this new device for checking the potentiometer 32, with the same reference numbers being used to denote the same elements in each case.

To test the potentiometer 32, the microcontroller 12 applies a high voltage potential of 5 Volts, for example, to the port A_P1. The microcontroller 14 switches its port B_P1 to high impedance, which is depicted in FIG. 3 by the terminal 36 being disconnected from the port B_P1. In addition, the microcontroller 14 applies a low voltage potential, preferably ground potential, to the port B_TEST. In this case, the first partial impedance 40 of the potentiometer 32 together with the fixed resistor 45 forms a potential divider. The partial-voltage drop across the partial impedance 40 can be measured at the inputs A_IN, B_IN. This voltage drop across the partial impedance 40 is a measure for the quantity of the partial impedance 40.

Then, as shown in FIG. 4, the second partial impedance 42 of the potentiometer 32 is determined by the microcontroller 14 applying a high voltage potential, for example 5 Volts, to its port B_P1, while the microcontroller 12 switches its port A_P1 to high impedance. The potential divider is now formed from the second partial impedance 42 and the fixed resistor 45. The voltage drop across the partial impedance 42 can be measured at the inputs A_IN, B_IN. It is possible to detect any contact errors and also any drift errors of the potentiometer 32 by adding the measured partial voltages/partial impedances. In addition, the instantaneous position of the potentiometer 32 can be determined from the known values for the two partial impedances 40, 42, enabling a plausibility check because the control position of the potentiometer 32 can also be found by measurement in the manner described below. Finally, this test scenario can also be used to detect stuck-at errors at said ports of the microcontrollers 12, 14.

The control position of the potentiometer 32 can be measured in the arrangement shown in FIG. 2 by port B_TEST being switched to high impedance (switching element 48 open), a high voltage potential, for example 5 Volts, being applied to the port A_P1 of the microcontroller 12, and a low voltage potential, for example ground potential, being applied to the port B_P1 of the microcontroller 14. The voltage potentials at the ports A_P1, B_P1 could also be swapped over. In both cases, a voltage lies across the potentiometer 32, with the tap 38 forming a voltage divider. The control position of the potentiometer 32 can be measured by reading the partial voltage present at the tap 38.

As persons skilled in the relevant art can easily understand, the pre-sent circuit for failsafe evaluation of the potentiometer 32 can also be operated with different supply voltages to the microcontrollers 12, 14. This enables a particularly high level of failsafe reliability because of diverse redundancy. In addition, this exemplary embodiment has the advantage that the control position of the potentiometer 32 does not depend on the particular impedance value of the potentiometer, nor does it depend on the values and tolerances of the fixed resistor 45 or of the wiper contact resistance of the potentiometer, nor on the supply voltage. In addition, the partial voltage present at the tap 38 varies linearly with the change in control position, so that a plurality of control positions can be identified with the same precision over the entire operating range of the potentiometer 32.

The implementation described here comprising two microcontrollers is preferred in safety switching devices that already use redundant microcontrollers for evaluating and monitoring signaling devices. The additional component cost is minimal. In principle, however, the invention can also be implemented using just one microcontroller (or another "single-channel" evaluation unit) by measuring the first measurement value and second measurement value sequentially and/or via different port inputs of the one evaluation unit.

Figure 5:
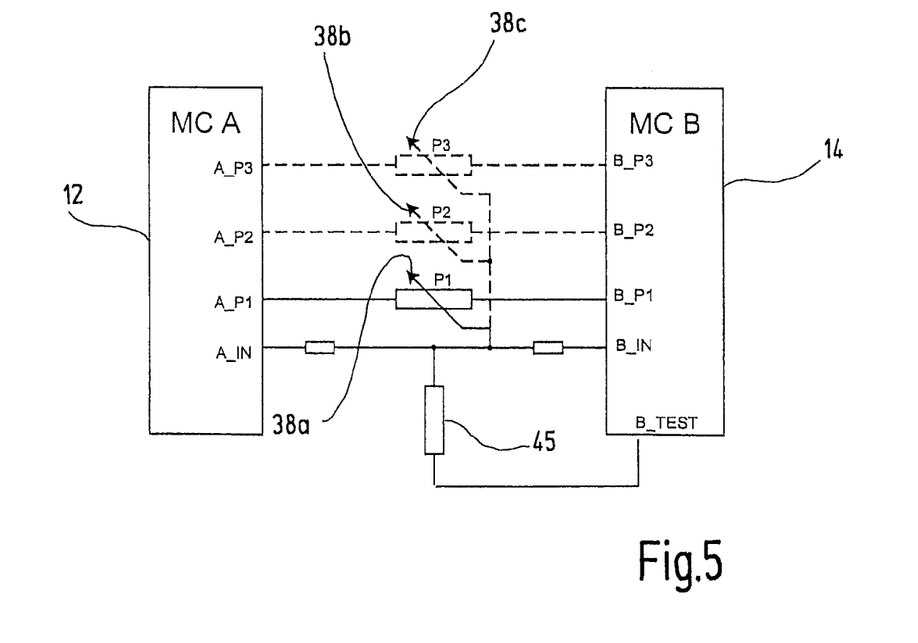
FIG. 5 shows a second exemplary embodiment of the new device.

FIG. 5 shows another exemplary embodiment, wherein the same reference numbers denote the same elements as before. In this case, three potentiometers P1, P2, P3 are connected by their first and second terminals between corresponding ports of the microcontrollers 12, 14. The taps 38a, 38b, 38c of the three potentiometers are brought together at a node, and, in the manner previously described, connected both to the inputs A_IN, B_IN of the two microcontrollers 12, 14 and via the fixed resistor 45 to the port B_TEST. A plurality of potentiometers P1, P2, P3 can be evaluated and monitored in the manner previously described using such an arrangement. According to an alternative exemplary embodiment, another two resistors are shown in FIG. 5 in the connecting lines between the taps 38a, 38b, 38c and the inputs A_IN, B_IN of the microcontrollers 12, 14. These resistors are used here for decoupling, but can be dispensed with in other exemplary embodiments.

Figure 6:
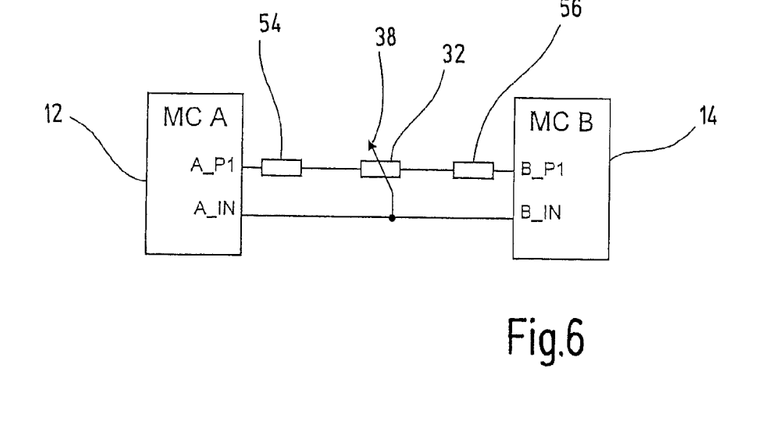
FIG. 6 shows a third exemplary embodiment of the new device.

FIG. 6 shows another exemplary embodiment of an arrangement for failsafe evaluation of a position encoder, once again for the example of a potentiometer 32. The same references denote the same elements as before. In the exemplary embodiment shown in FIG. 6, the potentiometer 32 lies with its terminals 34, 36 between the ports A_P1, B_P1 of the microcontroller 12, 14. The tap 38 is connected in parallel with the two inputs A_IN, B_IN of the microcontrollers 12, 14. Unlike the previous exemplary embodiment, two fixed resistors 54, 56 are used, the resistor 54 lying between the first terminal 34 of the potentiometer 32 and the port A_P1 of the microcontroller 12, while the second resistor 56 lies between the second terminal 36 of the potentiometer 32 and the port B_P1 of the microcontroller 14. In the case where the microcontrollers 12, 14 have different supply voltages, it is possible to avoid that the microcontroller which has the lower supply voltage is presented with a voltage potential that exceeds its supply voltage by means of the resistors 54, 56. The two resistors 54, 56 are preferably of equal value, so that the voltage at the tap 38 is exactly half the voltage applied across the series circuit 32, 54, 56 when the potentiometer 32 is in its centre position. The partial impedances of the potentiometer 32 can be determined by alternately switching over the potentials at the port outputs A_P1, B_P1, and a plausibility test for checking the operation of the potentiometer 32 is possible.

Figure 7:
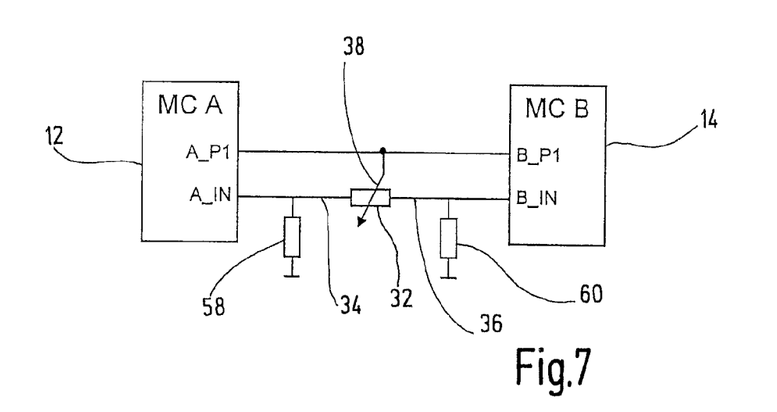
FIG. 7 shows a fourth exemplary embodiment of the new device.

FIG. 7 shows an exemplary embodiment, wherein the potentiometer 32 lies with its terminals 34, 36 between the inputs A_IN, B_IN of the microcontrollers 12, 14. The tap 38 is connected in parallel with the ports A_P1, B_P1. In addition, the terminal 34 is connected via a resistor 58 to ground, and the terminal 36 is connected via a resistor 60 to ground. In this case, an alternately changing voltage potential can be supplied to the tap 38 by one of the microcontrollers 12, 14 switching its port to high impedance while the other outputs a high potential.

Figure 8:
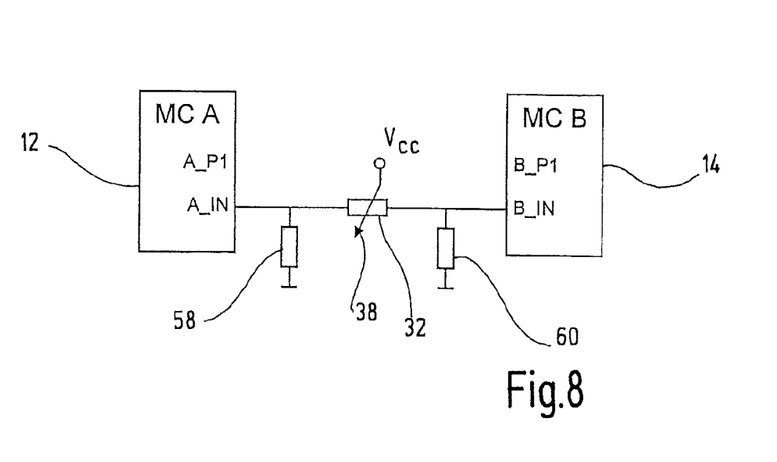
FIG. 8 shows a fifth exemplary embodiment of the new device.

The exemplary embodiment shown in FIG. 8 is equivalent to the exemplary embodiment in FIG. 7 except that a fixed potential $V_{cc}$ is applied to the tap 38. In the latter two exemplary embodiments, the microcontrollers measure respectively opposing partial voltages across the potentiometer 32, which correspond to the respective partial impedances.

What is claimed is:

1. A safety switching device for failsafe shutdown of an electrical load, comprising:
   at least one input terminal for receiving a status signal representing a safety request,
   an evaluation and control unit for evaluating the status signal,
   at least one switching element controlled by the evaluation and control unit in response to the status signal, and
   at least one position encoder for setting an operational quantity, the at least one position encoder comprising a first terminal, a second terminal, and a tap having a variable instantaneous position, with a total impedance being defined between the first terminal and the second terminal, with a first partial impedance being defined between the first terminal and the tap, and with a second partial impedance being defined between the tap and the second terminal,
   wherein the evaluation and control unit is configured to determine a first measurement value representative of the first partial impedance and to determine a second measurement value representative of the second partial impedance in order to determine the instantaneous position of the tap in a failsafe manner.

2. The safety switching device of claim 1, wherein the evaluation and control unit comprises a first evaluation circuit and a second evaluation circuit, the first and second evaluation circuits both being designed to determine at least one of the measurement values.

3. The safety switching device of claim 2, wherein the first evaluation circuit has a first output, wherein the second evaluation circuit has a second output, and wherein the first and second outputs both are configured to alternately provide a high potential or a low potential.

4. The safety switching device of claim 3, wherein the first output is connected to the first terminal of the position encoder, and the second output is connected to the second terminal of the position encoder.

5. The safety switching device of claim 4, wherein the first and second evaluation circuits both are configured to isolate the output from the position encoder.

6. The safety switching device of claim 3, wherein the first output and the second output both are connected to the tap.

7. The safety switching device of claim 2, wherein the first evaluation circuit has a first input connected to the position encoder and the second evaluation circuit has a second input connected to the position encoder.

8. The safety switching device of claim 7, wherein the first input and the second input both are connected to the tap.

9. The safety switching device of claim 7, wherein the first input is connected to the first terminal of the position encoder, and the second input is connected to the second terminal of the position encoder.

10. The safety switching device of claim 2, wherein the first and second evaluation circuits are programmable integrated circuits connected together via the position encoder.

11. The safety switching device of claim 2, comprising a plurality of position encoders having a plurality of taps connected together, with each position encoder having a first terminal connected to the first evaluation circuit and having a second terminal connected to the second evaluation circuit.

12. The safety switching device of claim 1, further comprising a reference impedance coupled to the position encoder for providing a reference measurement value to the evaluation and control unit.

13. The safety switching device of claim 12, wherein the reference impedance has a first terminal connected to the tap.

14. The safety switching device of claim 13, wherein the reference impedance has a second terminal connected to an output of the evaluation and control unit.

15. The safety switching device of claim 1, wherein the position encoder is a potentiometer.

16. An arrangement for failsafe evaluation of a position encoder having a first terminal, a second terminal, and a moveable tap, with a total impedance being defined between the first terminal and the second terminal, with a first partial impedance being defined between the first terminal and the tap, and with a second partial impedance being defined between the tap and the second terminal, the arrangement comprising a first evaluation circuit designed to determine a first measurement value representative of the first partial impedance, and comprising a second evaluation circuit designed to determine a second measurement value representative of the second partial impedance, with at least one from the first and second evaluation circuits being designed to determine an instantaneous position of the tap by means of the first and second measurement values.

17. The arrangement of claim 16, wherein the first evaluation circuit has a first output configured to alternately provide a high potential or a low potential, wherein the second evaluation circuit has a second output configured to alternately provide a low potential or a high potential, and wherein the first output is connected to the first terminal and the second output is connected to the second terminal.

18. The arrangement of claim 17, wherein the first evaluation circuit has a first input and the second evaluation circuit has a second input, with the tap being connected to both the first and the second input.

19. The arrangement of claim 16, wherein the first evaluation circuit has a first input connected to the first terminal and wherein the second evaluation circuit has a second input connected to the second terminal, with the tap being connected to a defined high potential.

20. The arrangement of claim 16, wherein the first and second evaluation circuits each are integrated circuit components connected to each other via said position encoder.

* * * * *